(12) United States Patent
Ban et al.

(10) Patent No.: US 7,414,290 B2
(45) Date of Patent: Aug. 19, 2008

(54) DOUBLE GATE TRANSISTOR, METHOD OF MANUFACTURING SAME, AND SYSTEM CONTAINING SAME

(75) Inventors: Ibrahim Ban, Beaverton, OR (US); Uday Shah, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/474,153

(22) Filed: Jun. 23, 2006

(65) Prior Publication Data

US 2007/0296048 A1 Dec. 27, 2007

(51) Int. Cl.
*H01L 29/06* (2006.01)
(52) U.S. Cl. .................. 257/365; 257/410; 257/401; 257/649; 257/E29.022
(58) Field of Classification Search .......... 257/E29.022, 257/401, 640, 649, 410, 365
See application file for complete search history.

(56) References Cited

U.S. PATENT DOCUMENTS

| | | | |
|---|---|---|---|
| 7,053,449 B2 | 5/2006 | Segura et al. | |
| 7,148,526 B1* | 12/2006 | An et al. | 257/288 |
| 7,165,171 B2* | 1/2007 | Zhang et al. | 713/1 |
| 7,271,433 B1* | 9/2007 | Forbes | 257/302 |
| 2004/0222466 A1* | 11/2004 | Fried et al. | 257/347 |
| 2007/0075351 A1* | 4/2007 | Schulz et al. | 257/314 |
| 2007/0158756 A1* | 7/2007 | Dreeskornfeld et al. | 257/374 |

* cited by examiner

*Primary Examiner*—Evan Pert
*Assistant Examiner*—Victor A. Mandala, Jr.
(74) *Attorney, Agent, or Firm*—Kenneth A. Nelson (57) ABSTRACT

A double gate transistor comprises a substrate (105, 905) and first and second electrically insulating layers (110, 910), (120, 920). The first and second electrically insulating layers form a fin (130, 930). A first gate dielectric (140, 940) is at a first side (131, 931) of the fin and a second gate dielectric (150, 950) is at a second side (132, 932) of the fin. A first metal region (160, 960) is adjacent to the first gate dielectric and has a first surface (161, 961), and a second metal region (170, 970) is adjacent to the second gate dielectric and has a second surface (171, 971). The first electrically insulating layer has a third surface (111, 911), the second electrically insulating layer has a fourth surface (121, 921), and the first surface and the second surface lie between the third and fourth surfaces.

17 Claims, 6 Drawing Sheets

DOUBLE GATE TRANSISTOR, METHOD OF MANUFACTURING SAME, AND SYSTEM CONTAINING SAME

FIELD OF THE INVENTION

The disclosed embodiments of the invention relate generally to semiconductor technology, and relate more particularly to double gate transistors.

BACKGROUND OF THE INVENTION

Transistors are foundational devices of the semiconductor industry. One type of transistor, the field effect transistor (FET), has among its components gate, source, and drain terminals. A voltage applied between the gate and the source terminals generates an electric field that creates an "inversion channel" though which current can flow. Such current flow may be controlled by varying the magnitude of the applied voltage.

Many configurations and fabrication methods have been devised for transistor gate terminals (as well as for other transistor components). One such configuration is what is frequently called a double gate transistor, in which a transistor has two gates instead of a single gate. Another such configuration is a gate in which a film having a high dielectric constant replaces a conventional gate oxide material for the purpose of overcoming some of the problems arising from such conventional gate oxide materials as they are increasingly thinned as a result of advancing technology and customer demand. Underlying all such attempts to advance the art of transistor gate formation and configuration is a desire to reduce costs and increase efficiency. Accordingly, a efficient and effective double gate transistor and a corresponding fabrication method would represent a welcome advance in the art.

BRIEF DESCRIPTION OF THE DRAWINGS

The disclosed embodiments will be better understood from a reading of the following detailed description, taken in conjunction with the accompanying figures in the drawings in which.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner.

DETAILED DESCRIPTION OF THE DRAWINGS

In one embodiment of the invention, a double gate transistor comprises a substrate, a first electrically insulating layer over the substrate, and a second electrically insulating layer over the first electrically insulating layer. The first electrically insulating layer and the second electrically insulating layer form a fin over the substrate. The double gate transistor further comprises a first gate dielectric, which may be a film having a high dielectric constant, at a first side of the fin and a second gate dielectric at a second side of the fin. A first metal region is adjacent to the first gate dielectric and has a first surface, and a second metal region is adjacent to the second gate dielectric and has a second surface. A first polysilicon region is adjacent to the first metal region and a second polysilicon region is adjacent to the second metal region. The first electrically insulating layer has a third surface, the second electrically insulating layer has a fourth surface, and the first surface and the second surface lie between the third surface and the fourth surface.

According to an embodiment of the invention, a method of manufacturing a double gate transistor comprises: providing a substrate having a fin formed thereon, where the fin comprises first and second electrically insulating layers; forming a dielectric layer over the substrate and the fin; forming a metal layer over the dielectric layer; removing a portion of the metal layer; removing a portion of the dielectric layer such that a gate structure is formed; forming a polysilicon layer over the first electrically insulating layer and the gate structure; and removing a portion of the polysilicon layer to form a double gate structure.

Double gate transistors according to embodiments of the invention, which include both N-type metal oxide semiconductor (NMOS) or P-type metal oxide semiconductor (PMOS) double gate transistors, can be used as logic transistors, memory cells or components thereof, or the like. Methods according to embodiments of the invention integrate embodiments of the invention with a larger process flow in order to fabricate such logic transistors and memory cells and the like.

Figure 1:
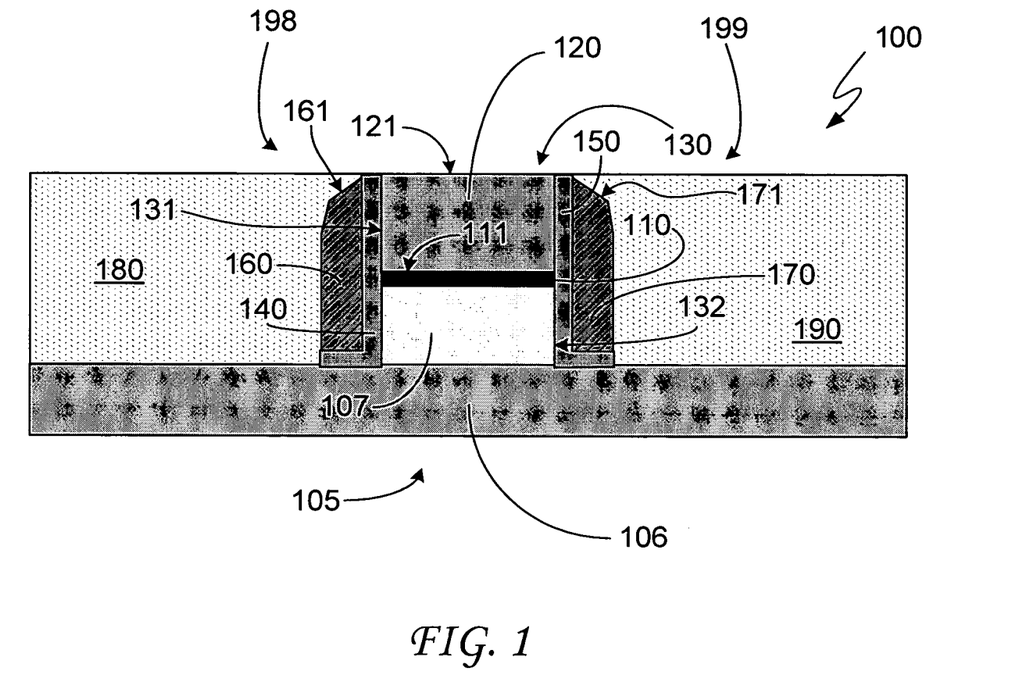
FIG. 1 is a cross-sectional view of a double gate transistor according to an embodiment of the invention.

Referring now to the figures, FIG. 1 is a cross-sectional view of a double gate transistor 100 according to an embodiment of the invention. As illustrated in FIG. 1, double gate transistor 100 comprises a substrate 105, an electrically insulating layer 110 over substrate 105, and an electrically insulating layer 120 over electrically insulating layer 110. In one embodiment electrically insulating layer 110 is an oxide layer, and in the same or another embodiment electrically insulating layer 120 is a nitride layer. Electrically insulating layer 110 and electrically insulating layer 120 form a fin 130 over substrate 105. Electrically insulating layer 110 has a surface 111 and electrically insulating layer 120 has a surface 121.

In one embodiment substrate 105 is a bulk substrate comprising silicon or the like. In the illustrated embodiment substrate 105 is a silicon-on-insulator (SOI) substrate comprising an electrically insulating layer 106 and a semiconducting layer 107 over electrically insulating layer 106. As an example, electrically insulating layer 106 can be a buried oxide layer or the like and semiconducting layer 107 can be a layer of silicon, silicon germanium (SiGe), silicon carbide, or the like.

Double gate transistor 100 further comprises a gate dielectric 140 at a side 131 of fin 130 and a gate dielectric 150 at a side 132 of fin 130. In one embodiment, one or both of gate dielectric 140 and gate dielectric 150 comprise a hafnium-based dielectric material that may have a dielectric constant (K) of at least approximately 20. In a particular embodiment the hafnium-based dielectric material is hafnium oxide having a dielectric constant of between approximately 20 and approximately 40. In a different embodiment, one or both of gate dielectric 140 and gate dielectric 150 comprise a zirconium-based dielectric material that may have a dielectric constant of at least approximately 20. In a particular embodiment the zirconium-based dielectric material is zirconium oxide having a dielectric constant of between approximately 20 and approximately 40.

Silicon dioxide, which is currently widely used as a gate dielectric, has a dielectric constant of approximately 3.9. The dielectric constant of air is used as a reference point, and is defined as 1. On that scale, hafnium oxide, zirconium oxide, titanium oxide, and the like qualify as, and are often referred to as, high-K materials, high-K films, high-K dielectrics, or a similar label that alludes to the relatively high dielectric constant of such materials.

Double gate transistor 100 still further comprises a metal spacer or metal region 160 adjacent to gate dielectric 140 and a metal spacer or metal region 170 adjacent to gate dielectric 150. As an example, metal regions 160 and 170 can comprise titanium nitride, tantalum nitride, or the like. The choice of metal allows the work function, and thus the device threshold voltage, to be set appropriately.

Metal region 160 has a surface 161 and metal region 170 has a surface 171. Surface 161 and surface 171 lie between surfaces 111 and 121, meaning that a shortest distance between surface 111 and surface 161, as well as a shortest distance between surface 111 and surface 171, is less than a shortest distance between surface 111 and surface 121. Double gate transistor 100 also comprises a polysilicon region 180 adjacent to metal region 160 and a polysilicon region 190 adjacent to metal region 170. Metal region 160 and polysilicon region 180 form a gate 198 of double gate transistor 100, and metal region 170 and polysilicon region 190 form a gate 199 of double gate transistor 100.

FIG. 1 depicts double gate transistor 100 following the completion of certain processing steps leading to its manufacture according to an embodiment of the invention. Subsequent figures, introduced and described below, depict double gate transistor 100 in various prior stages of manufacture as will be discussed in greater detail below.

Figure 2:
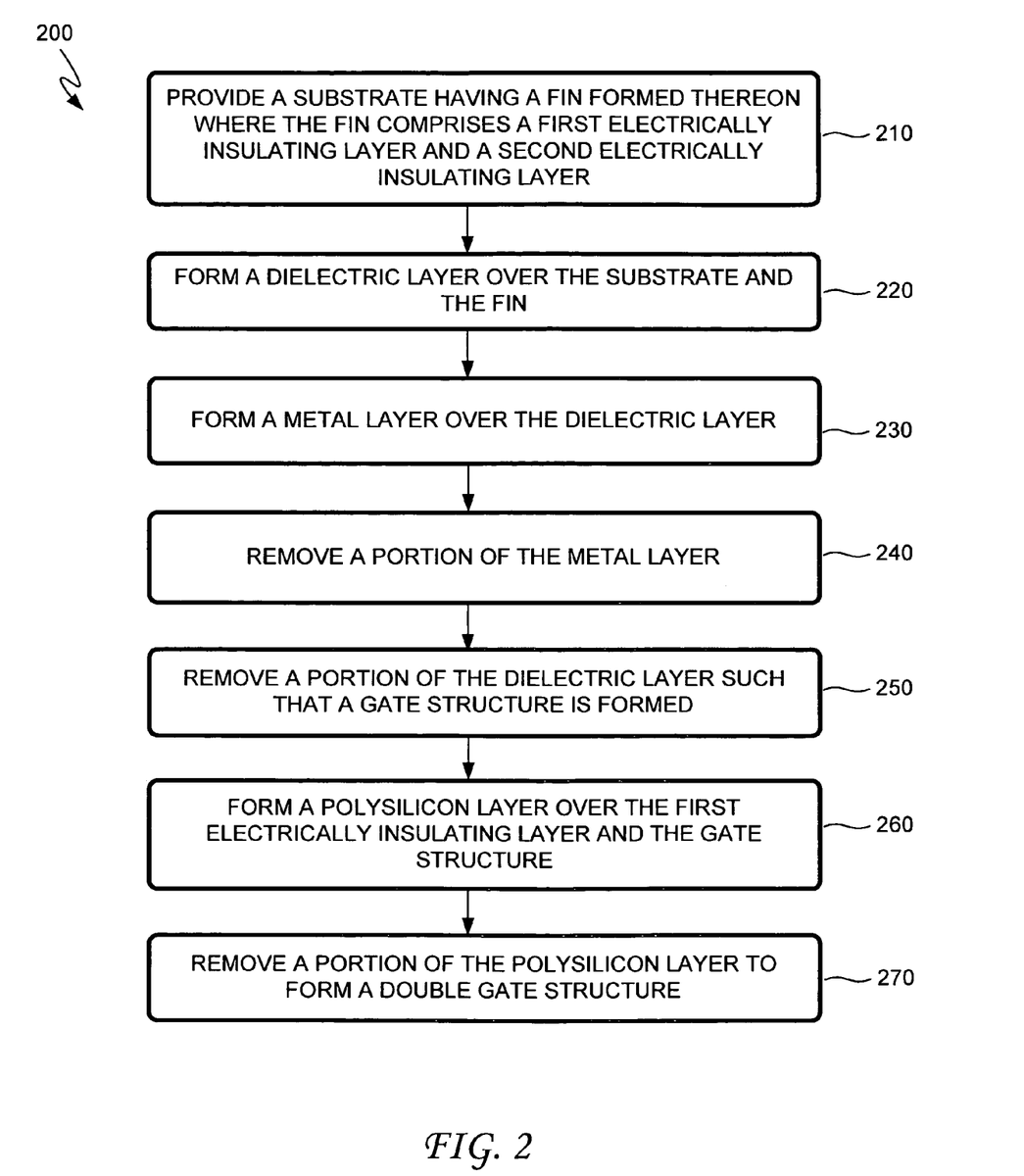
FIG. 2 is a flowchart illustrating a method of manufacturing a double gate transistor according to an embodiment of the invention.

FIG. 2 is a flowchart illustrating a method 200 of manufacturing a double gate transistor according to an embodiment of the invention. Method 200 describes an integration scheme according to an embodiment of the invention allowing a double gate transistor according to embodiments of the invention to be inserted in a conventional process flow with minimal perturbation. As an example, the integration scheme can be inserted in a double gate transistor fabrication process at the gate formation stage.

Figure 3:
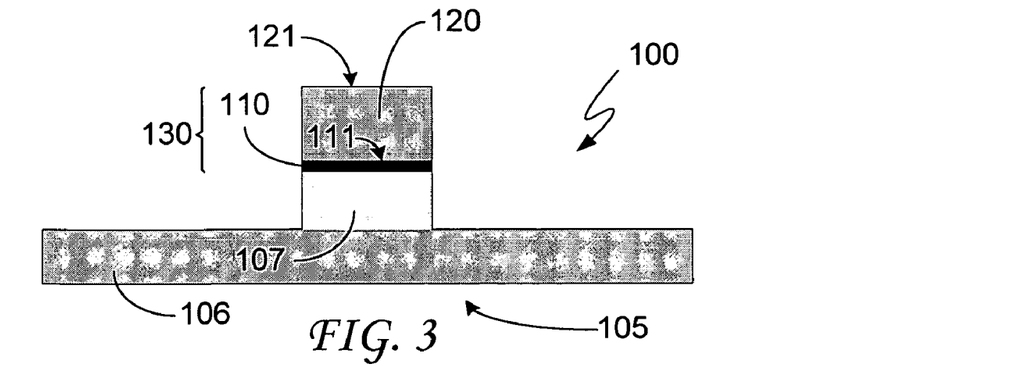
FIGS. 3-8 are cross-sectional views of a double gate transistor at particular points in a manufacturing process according to an embodiment of the invention.

A step 210 of method 200 is to provide a substrate having a fin formed thereon where the fin comprises a first electrically insulating layer and a second electrically insulating layer. As mentioned, such a structure is one that may be formed in a conventional double gate transistor process flow. In one embodiment the substrate can be similar to substrate 105, first shown in FIG. 1, in that step 210 comprises providing a buried oxide layer, a silicon layer over the buried oxide layer, an oxide layer over the silicon layer, and a nitride layer over the oxide layer. In a different embodiment, step 210 comprises providing a bulk silicon layer. As an example, the buried oxide layer, the silicon layer, the oxide layer, and the nitride layer can be similar to, respectively, buried oxide layer 106, silicon layer 107, electrically insulating layer 110, and electrically insulating layer 120, all of which were first shown in FIG. 1. As another example the fin can be similar to fin 130 which was first shown in FIG. 1. Substrate 105, electrically insulating layers 110 and 120, and fin 130 are also shown in FIG. 3, which is a cross-sectional view of double gate transistor 100 at a particular point in method 200 or another manufacturing process according to an embodiment of the invention.

Figure 4:
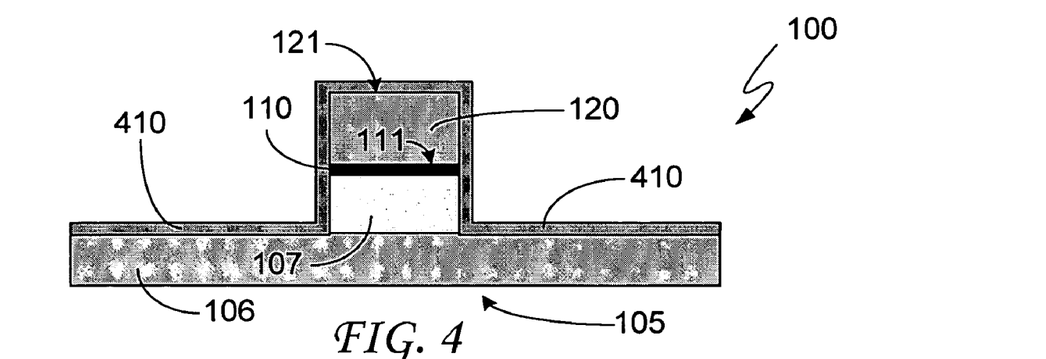

A step 220 of method 200 is to form a dielectric layer over the substrate and the fin. In one embodiment step 220 comprises or is a part of a process resulting in a self-aligned high-K dielectric layer formation. As an example, the dielectric layer can be similar to a dielectric layer 410 first shown in FIG. 4, which is a cross-sectional view of double gate transistor 100 at a particular point in method 200 or another manufacturing process according to an embodiment of the invention. In one embodiment step 220 comprises first growing an oxide layer (not shown) and then depositing one of a hafnium-based dielectric material and a zirconium-based dielectric material. Alternatively, a titanium-based dielectric material or the like may be deposited instead of the hafnium-based or zirconium-based dielectric material. In one embodiment the oxide layer can be very thin—on the order of a single atomic layer. In the same or another embodiment the deposition of the dielectric material can be performed using atomic layer deposition or similar deposition technique.

Figure 5:
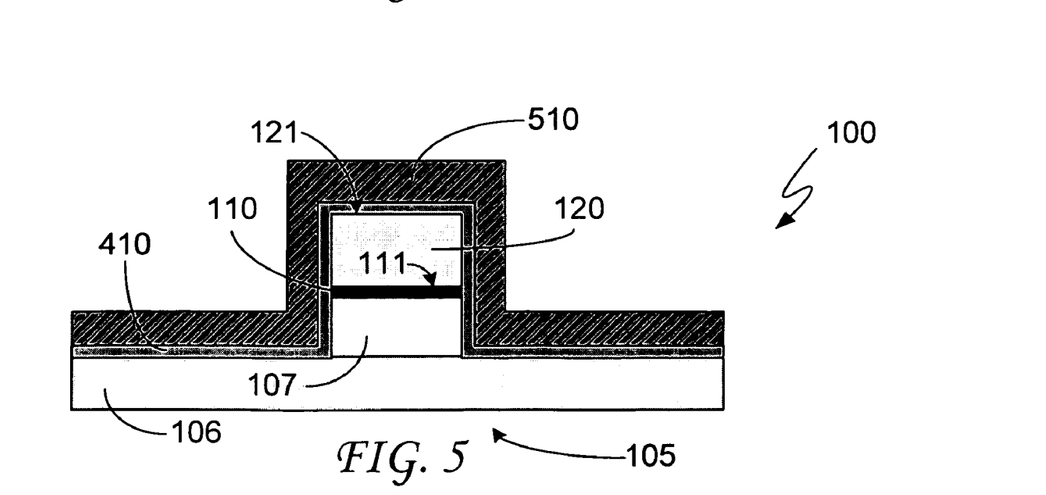

A step 230 of method 200 is to form a metal layer over the dielectric layer. In one embodiment step 230 comprises or is a part of a process resulting in a self-aligned metal gate formation. As an example, the metal layer can be similar to a metal layer 510 first shown in FIG. 5, which is a cross-sectional view of double gate transistor 100 at a particular point in method 200 or another manufacturing process according to an embodiment of the invention. In one embodiment, step 230 comprises depositing a layer comprising one of titanium nitride and tantalum nitride.

Figure 6:
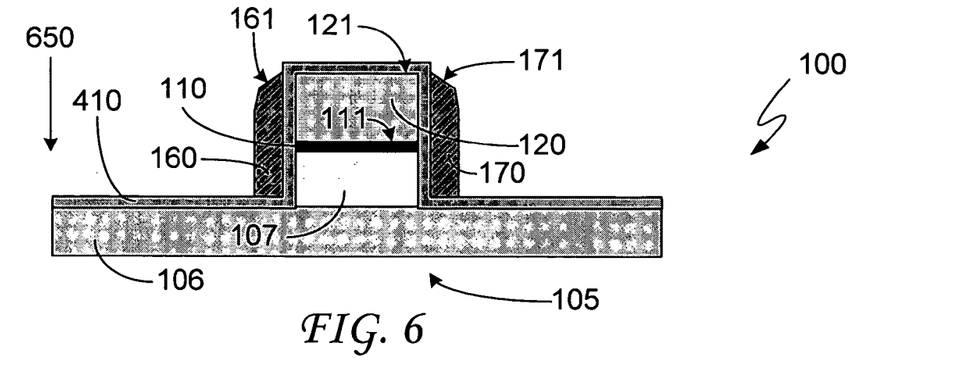

A step 240 of method 200 is to remove a portion of the metal layer. In one embodiment step 240 comprises a self-aligned removal of metal from areas where such metal is ultimately not wanted. As an example, step 240 can comprise removing all of metal layer 510 except for metal region 160 and metal region 170, as illustrated in FIG. 6, which is a cross-sectional view of double gate transistor 100 at a particular point in method 200 or another manufacturing process according to an embodiment of the invention. As described above in connection with FIG. 1, and as shown at least in FIGS. 1 and 6, metal region 160 has surface 161 and metal region 170 has surface 171.

In one embodiment step 240 comprises etching the portion of the metal layer using a dry etch process. As is known in the art, dry etch techniques make it possible to etch anisotropically such that, for example, metal layer 510 can be etched vertically but not horizontally, i.e., only in a direction 650 that is substantially perpendicular to surface 121 of electrically insulating layer 120. Accordingly, a dry etch performed as part of step 240 or another step may not only create metal regions 160 and 170 but may also locate surfaces 161 and 171 at a desired vertical location. As an example, the dry etch can locate surfaces 161 and 171 at any vertical location from surface 111 to surface 121, i.e., anywhere, in one embodiment, from the top of the nitride to the top of the SOI or other substrate.

In a particular embodiment surfaces 161 and 171 are etched in such a way that they lie below surface 121. In one manifestation of that particular embodiment surfaces 161 and 171 are etched so as to lie between surfaces 111 and 121, meaning surfaces 161 and 171 are below the level of surface 121 and above the level of surface 111. One potential advantage resulting from locating surfaces 161 and 171 below the level of surface 121 is that the removal of such excess metal at this stage rather than later on in method 200 or other manufacturing method means that a polysilicon removal step performed subsequently need not take place in the presence of metal under the polysilicon. If surfaces 161 and 171 were instead left at the level of surface 121 then surfaces 161 and 171 would be exposed to the polysilicon removal chemistry, thus requiring the introduction of additional process complexity in order to compensate for that exposure. Similarly, locating surfaces 161 and 171 below the level of surface 121 enables the metal to be isolated from the rest of the wafer during all subsequent processing, thus simplifying subsequent processing steps. Such isolation may be accomplished by encapsulating the metal with polysilicon, which is formed in a subsequent step as described below in connection with step 270 according to an embodiment of the invention.

As an example, step 240 can comprise an etch performed using metal chemistries containing one or more of hydrobromic acid (HBr), chlorine gas ($Cl_2$), boron trichloride ($BCl_3$), and argon (Ar), or the like. In one embodiment the etch, which may either be isotropic or anisotropic, may be carried out in an Electron Cyclotron Resonance Frequency (ECR) etcher, at an etch pressure between approximately 0.2 Pascals (Pa) and approximately 1.0 Pa. As an example, the etch may be selectively performed on the gate dielectric layers and the electrically insulating nitride layer. In one embodiment, the width of surfaces 161 and 171 is a function of: (a) the amount of metal initially deposited; and (b) the length and intensity of the etch procedure.

Figure 7:
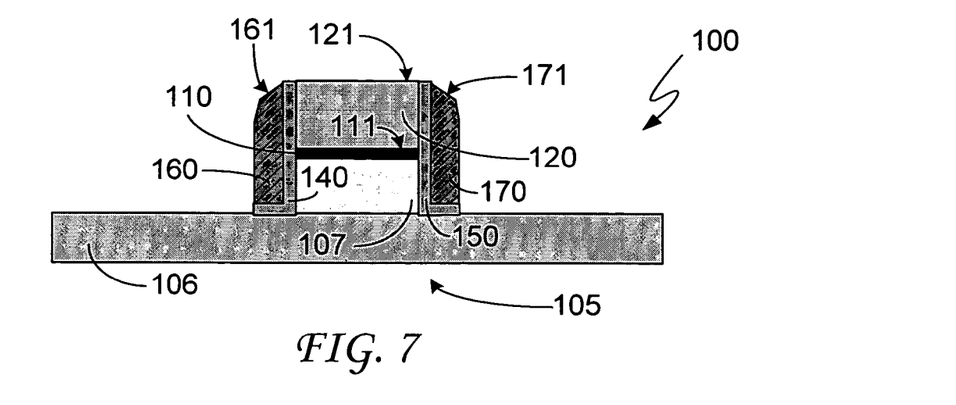

A step 250 of method 200 is to remove a portion of the dielectric layer such that a gate structure is formed. In one embodiment step 250 comprises a self-aligned removal of a high-K dielectric layer from areas where such high-K material is ultimately not wanted. As an example, step 250 can comprise removing the exposed areas of high-K material, i.e., all of the dielectric layer except for gate dielectric 140 and gate dielectric 150. The result is illustrated in FIG. 7, which is a cross-sectional view of double gate transistor 100 at a particular point in method 200 or another manufacturing process according to an embodiment of the invention. In one embodiment step 250 comprises selectively etching the portion of the dielectric layer using one of a wet etch and a dry etch process according to techniques known in the art.

Figure 8:
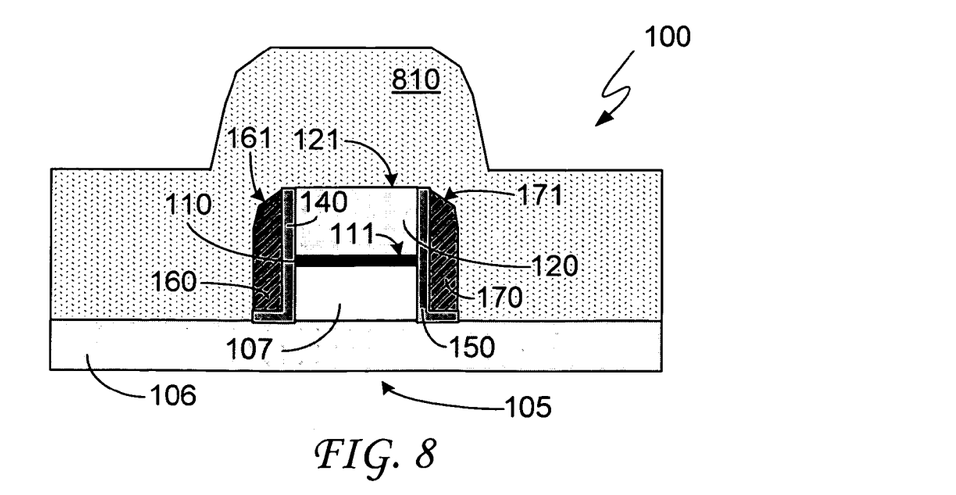

A step 260 of method 200 is to form a polysilicon layer over the first electrically insulating layer and the gate structure. As an example, the polysilicon layer can be similar to a polysilicon layer 810 first shown in FIG. 8, which is a cross-sectional view of double gate transistor 100 at a particular point in method 200 or another manufacturing process according to an embodiment of the invention.

A step 270 of method 200 is to remove a portion of the polysilicon layer to form a double gate structure. As an example, the double gate structure can be similar to double gate transistor 100 as shown in FIG. 1. As another example, the double gate structure can be similar to double gate transistor 900 shown in FIG. 9 below. In one embodiment, the portion of the polysilicon layer is located above surface 121 of electrically insulating layer 120, and step 270 comprises performing a polishing operation on the portion of the polysilicon layer. For example, the portion of the polysilicon layer can be removed using a chemical mechanical polishing (CMP) process according to techniques known in the art. In a particular embodiment, and to summarize the foregoing, step 270 comprises using CMP to polish the polysilicon down to the level of nitride, thereby forming two independent gates. As has been explained above, in at least one embodiment metal is not exposed to the CMP process.

A potential advantage resulting from locating surfaces 161 and 171 below the level of surface 121 was discussed above. Another such advantage has to do with an etch stop for the polysilicon removal just described in connection with step 270. The metal of metal layer 510 and metal regions 160 and 170 is a poor etch stop layer, as is the high-K material of dielectric layer 410 and gate dielectrics 140 and 150. Trying to stop the polysilicon CMP on either of such layers can result in metal and/or high-K material getting left behind, thus requiring a separate cleaning step. Such complications are avoided by locating surface 161 and 171 below the level of surface 121, as described.

Following the performance of method 200, processing can continue with polysilicon lithography and patterning as known in the art. Conventional contact and metal upper layer processing could be used to complete the fabrication.

Figure 9:
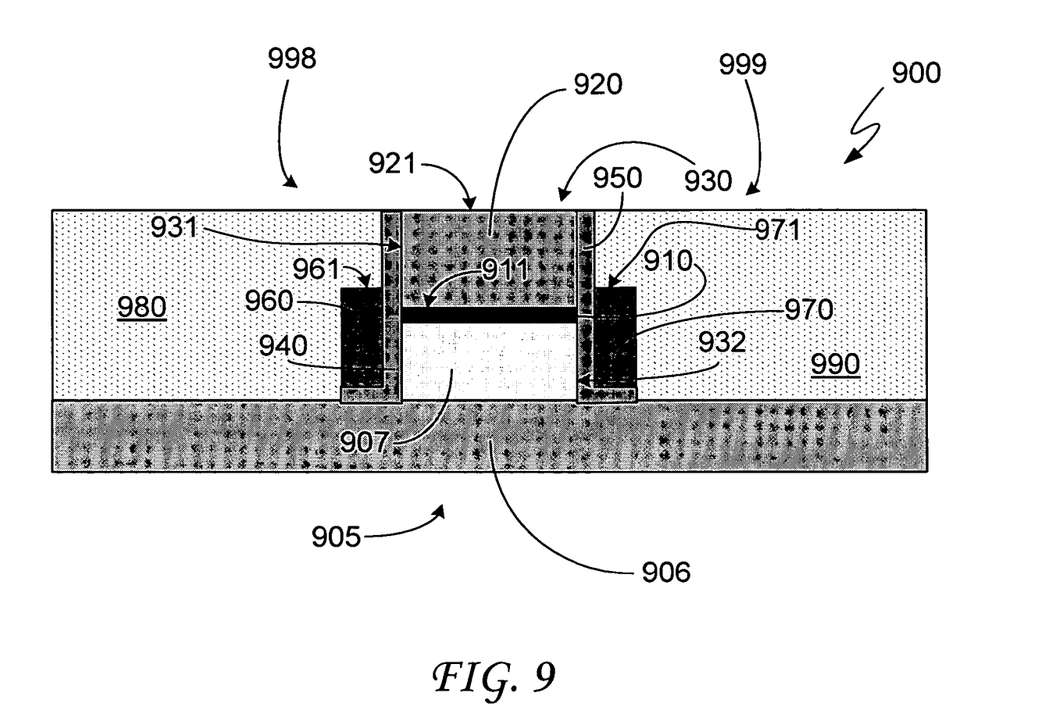
FIG. 9 is a cross-sectional view of a double gate transistor according to another embodiment of the invention.

FIG. 9 is a cross-sectional view of a double gate transistor 900 according to an embodiment of the invention. As illustrated in FIG. 9, double gate transistor 900 comprises a substrate 905, an electrically insulating layer 910 over substrate 905, and an electrically insulating layer 920 over electrically insulating layer 910. In one embodiment electrically insulating layer 910 is an oxide layer, and in the same or another embodiment electrically insulating layer 920 is a nitride layer. Electrically insulating layer 910 and electrically insulating layer 920 form a fin 930 over substrate 905. Electrically insulating layer 910 has a surface 911 and electrically insulating layer 920 has a surface 921.

In one embodiment substrate 905 is a bulk substrate comprising silicon or the like. In the illustrated embodiment substrate 905 is a silicon-on-insulator (SOI) substrate comprising an electrically insulating layer 906 and a semiconducting layer 907 over electrically insulating layer 906. As an example, electrically insulating layer 906 can be a buried oxide layer or the like and semiconducting layer 907 can be a layer of silicon, silicon germanium (SiGe), silicon carbide, or the like.

Double gate transistor 900 further comprises a gate dielectric 940 at a side 931 of fin 930 and a gate dielectric 950 at a side 932 of fin 930. In one embodiment, one or both of gate dielectric 940 and gate dielectric 950 are the same as or similar to one or both of gate dielectrics 140 and 150, first shown in and described in connection with FIG. 1.

Double gate transistor 900 still further comprises a metal spacer or metal region 960 adjacent to gate dielectric 940 and a metal spacer or metal region 970 adjacent to gate dielectric 950. As an example, metal regions 960 and 970 can comprise titanium nitride, tantalum nitride, or the like.

Metal region 960 has a surface 961 and metal region 970 has a surface 971. Surface 961 and surface 971 lie between surfaces 911 and 921, meaning that a shortest distance between surface 911 and surface 961, as well as a shortest distance between surface 911 and surface 971, is less than a shortest distance between surface 911 and surface 921.

Note that in FIG. 9, surfaces 961 and 971 are substantially parallel to surfaces 911 and 921, while surfaces 161 and 171 (see FIGS. 1, 6, 7, and 8) are angled with respect to surfaces 111 and 121. That difference is of minor significance in embodiments where the surfaces of the metal spacers (i.e., surfaces 161, 171 and 961, 971) are not recessed below the level of the surface of the second electrically insulating layer (i.e., surface 121, 921). However, in embodiments where the surfaces of the metal spacers are so recessed, especially where the metal spacers are recessed to or nearly to the level of the surface of the first electrically insulating layer (i.e., surface 111, 911), the flatness of the surfaces of the metal spacers has an effect on the work function because of the work function's dependence on metal thickness. FIG. 9 depicts what may be considered an ideal configuration, where the metal spacer thickness is substantially uniform. FIGS. 1, 6, 7, and 8 depict a configuration that may be more readily manufacturable using standard processes.

Double gate transistor 900 also comprises a polysilicon region 980 adjacent to metal region 960 and a polysilicon region 990 adjacent to metal region 970. Metal region 960 and polysilicon region 980 form a gate 998 of double gate transistor 900, and metal region 970 and polysilicon region 990 form a gate 999 of double gate transistor 900.

Figure 10:
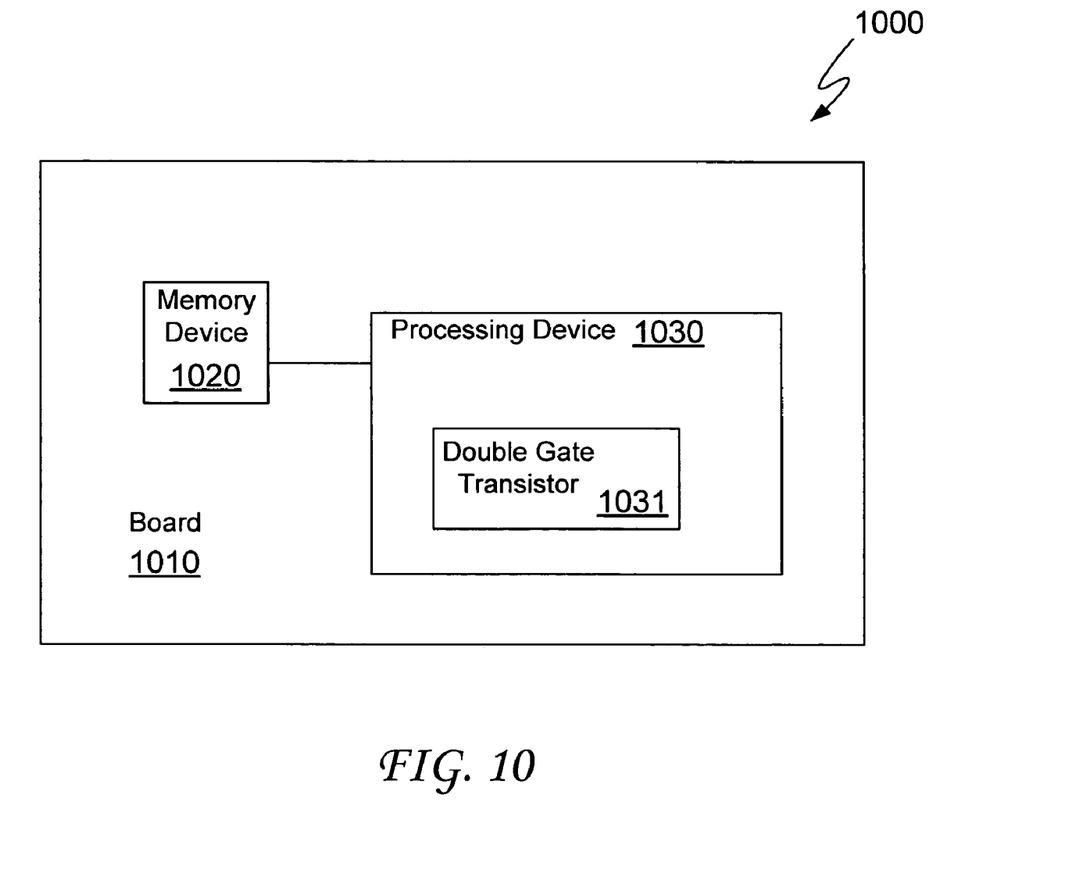
FIG. 10 is a schematic representation of a system in which a double gate transistor according to an embodiment of the invention may be used.

FIG. 10 is a schematic representation of a system 1000 in which a double gate transistor according to an embodiment of the invention may be used. As illustrated in FIG. 10, system 1000 comprises a board 1010, a memory device 1020 disposed on board 1010, and a processing device 1030 disposed on board 1010 and coupled to memory device 1020. Processing device 1030 includes a double gate transistor 1031. As an example, double gate transistor 1031 can be similar to double gate transistor 100, first shown in FIG. 1. As another example, double gate transistor 1031 can be similar to double gate transistor 900, shown in FIG. 9.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the double gate transistor and related manufacturing method discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A double gate transistor comprising:
a substrate;
a first electrically insulating layer over the substrate;
a second electrically insulating layer over the first electrically insulating layer, the first electrically insulating layer and the second electrically insulating layer forming a fin over the substrate;
a first gate dielectric at a first side of the fin;
a second gate dielectric at a second side of the fin;
a first metal region adjacent to the first gate dielectric and having a first surface;
a second metal region adjacent to the second gate dielectric and having a second surface;
a first polysilicon region adjacent to the first metal region; and
a second polysilicon region adjacent to the second metal region,
wherein:
the first electrically insulating layer has a third surface;
the second electrically insulating layer has a fourth surface; and
the first surface and the second surface lie between the third surface and the fourth surface.

2. The double gate transistor of claim 1 wherein:
the substrate comprises silicon.

3. The double gate transistor of claim 1 wherein:
the substrate comprises:
an electrically insulating layer; and
a semiconducting layer over the electrically insulating layer.

4. The double gate transistor of claim 1 wherein:
the first electrically insulating layer is an oxide layer.

5. The double gate transistor of claim 4 wherein:
the second electrically insulating layer is a nitride layer.

6. The double gate transistor of claim 1 wherein:
the first gate dielectric and the second gate dielectric comprise a hafnium-based dielectric material; and
the hafnium-based dielectric material has a dielectric constant of at least approximately 20.

7. The double gate transistor of claim 6 wherein:
the hafnium-based dielectric material is hafnium oxide; and
the hafnium oxide has a dielectric constant of between approximately 20 and approximately 40.

8. The double gate transistor of claim 1 wherein:
the first gate dielectric and the second gate dielectric comprise a zirconium-based dielectric material; and the zirconium-based dielectric material has a dielectric constant of at least approximately 20.

9. The double gate transistor of claim 8 wherein:
the zirconium-based dielectric material is zirconium oxide; and
the zirconium oxide has a dielectric constant of between approximately 20 and approximately 40.

10. The double gate transistor of claim 1 wherein:
the first metal region and the first polysilicon region form a first gate of the double gate transistor; and
the second metal region and the second polysilicon region form a second gate of the double gate transistor.

11. A system comprising:
a board;
a memory device disposed on the board; and
a processing device disposed on the board and coupled to the memory device, where the processing device includes a double gate transistor comprising:
a substrate;
a first electrically insulating layer over the substrate;
a second electrically insulating layer over the first electrically insulating layer, the first electrically insulating layer and the second electrically insulating layer forming a fin over the substrate;
a first gate dielectric at a first side of the fin;
a second gate dielectric at a second side of the fin;
a first metal region adjacent to the first gate dielectric and having a first surface;
a second metal region adjacent to the second gate dielectric and having a second surface;
a first polysilicon region adjacent to the first metal region; and
a second polysilicon region adjacent to the second metal region,
wherein:
the first electrically insulating layer has a third surface;
the second electrically insulating layer has a fourth surface; and
the first surface and the second surface lie between the third surface and the fourth surface.

12. The system of claim 11 wherein:
the substrate comprises silicon.

13. The system of claim 11 wherein:
the substrate comprises:
an electrically insulating layer; and
a semiconducting layer over the electrically insulating layer.

14. The system of claim 11 wherein:
the first electrically insulating layer is an oxide layer; and
the second electrically insulating layer is a nitride layer.

15. The system of claim 14 wherein:
the first gate dielectric and the second gate dielectric comprise a hafnium-based dielectric material having a dielectric constant of between approximately 20 and approximately 40.

16. The system of claim 14 wherein:
the first gate dielectric and the second gate dielectric comprise a zirconium-based dielectric material having a dielectric constant of between approximately 20 and approximately 40.

17. The system of claim 14 wherein:
the first metal region and the first polysilicon region form a first gate of the double gate transistor; and
the second metal region and the second polysilicon region form a second gate of the double gate transistor.

* * * * *